United States Patent
Udagawa

(10) Patent No.: US 7,018,728 B2
(45) Date of Patent: Mar. 28, 2006

(54) BORON PHOSPHIDE-BASED SEMICONDUCTOR DEVICE AND PRODUCTION METHOD THEREOF

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 41 days.

(21) Appl. No.: 10/467,677

(22) PCT Filed: Dec. 12, 2002

(86) PCT No.: PCT/JP02/13009

§ 371 (c)(1),
(2), (4) Date: Aug. 11, 2003

(87) PCT Pub. No.: WO03/054976

PCT Pub. Date: Jul. 3, 2003

(65) Prior Publication Data

US 2004/0232404 A1    Nov. 25, 2004

Related U.S. Application Data

(60) Provisional application No. 60/343,233, filed on Dec. 31, 2001.

(30) Foreign Application Priority Data

Dec. 14, 2001    (JP) .............................. 2001-381988

(51) Int. Cl.
    *B32B 9/00*    (2006.01)
    *H01L 21/22*    (2006.01)
    *H01L 33/00*    (2006.01)

(52) U.S. Cl. ............... 428/704; 428/688; 257/102; 257/103; 257/190; 438/565; 438/566; 438/569; 438/935

(58) Field of Classification Search ............ 428/704, 428/688; 257/102, 103, 190; 438/565, 566, 438/569, 495, 935
    See application file for complete search history.

(56) References Cited

U.S. PATENT DOCUMENTS

3,877,060 A * 4/1975 Shono et al. .............. 257/76
4,214,926 A   7/1980 Katsuto et al.
5,042,043 A   8/1991 Hatano et al.
6,069,021 A   5/2000 Terashima et al.

FOREIGN PATENT DOCUMENTS

DE    27 29 889 A1    1/1978

(Continued)

OTHER PUBLICATIONS

Toshiaki Ikoma, et al., Kagobutsu Handotai no Kiso Bussei Nyumon (Guide for Basic Physical Properties of Compound Semiconductor), 1$^{st}$ ed., pp. 14-17, Baifukan (Sep. 10, 1991).

(Continued)

*Primary Examiner*—Stephen Stein
(74) *Attorney, Agent, or Firm*—Sughrue Mion, PLLC

(57) ABSTRACT

A boron phosphide-based semiconductor device includes a single crystal substrate having formed thereon a boron-phosphide (BP)-based semiconductor layer containing boron and phosphorus as constituent elements, where phosphorus (P) occupying the vacant lattice point (vacancy) of boron (B) and boron occupying the vacant lattice point (vacancy) of phosphorus are present in the boron-phosphide (BP)-based semiconductor layer. The boron phosphide-based semiconductor device includes a p-type boron phosphide-based semiconductor layer in which boron occupying the vacancy of phosphorus is contained in a higher atomic concentration than phosphorus occupying the vacancy of boron and a p-type impurity of Group II element or Group I V element is added.

8 Claims, 2 Drawing Sheets

FOREIGN PATENT DOCUMENTS

| | | | | |
|---|---|---|---|---|
| DE | 2729889 | A | * | 1/1978 |
| JP | 53-4466 | A | | 1/1978 |
| JP | 53-4467 | A | | 1/1978 |
| JP | 53-108277 | A | | 9/1978 |
| JP | 54-52464 | A | | 4/1979 |
| JP | 2-275682 | A | | 11/1990 |
| JP | 10-242567 | A | | 9/1998 |
| JP | 11-266006 | A | | 9/1999 |
| JP | 2000-22211 | A | | 1/2000 |
| JP | 2000-31164 | A | | 1/2000 |
| JP | 2000-51270 | A | | 2/2000 |
| JP | 2000-235956 | A | | 8/2000 |

OTHER PUBLICATIONS

Iwao Teramoto, Handotai Device Gairon (Introduction to Semiconductor Devices), p. 28, Baifukan (Mar. 30, 1995).

Phillips, Handotai Ketsugo Ton (Bonds and Bands in Semiconductors), 3$^{rd}$ imp., p. 51, Yoshioka Shoten (Jul. 25, 1985).

Katsufusa Shono, Cho LSI Jidai no Handotai Gijutsu 100 Shu (100 Collections of Semiconductors Technique in VLSI Generation) [III], Ohmu Sha (Apr. 1, 1982), Electronics Library 18, pp. 86-87.

Hideaki Ikoma, et al., Kagobutsu Handotai no Kiso Bussei Nyumon (Guide for Basic Physical Properties of Compound Semiconductor), 1$^{st}$ ed., p. 141, Baifukan (Sep. 10, 1991).

M.J. Ludowise, Metalorganic chemical vapor deposition of III-V semiconductors, J. Appl. Phys., vol. 58 No. 8, pp. R31-R55 (Oct. 15, 1985).

T.L. Chu, et al., The Crystal Growth of Boron Monophosphide from Metal Phosphide Solutions, J. Electrochem. Soc., vol. 120, No. 6, pp. 802-806 (Jun. 1973).

T. Izumiya, et al., Growth of BP and GaN/BP heterostructures, Inst. Phys. Conf. Ser., No 129, Chapter 3, pp. 157-162, IOP Publishing Ltd. (1993).

Y. Kumashiro, et al., Preparation and Electrical Properties of Boron and Boron Phosphide Films Obtained by Gas Source Molecular Beam Deposition, Journal of Solid State Chemistry, 133, pp. 269-272 (1997).

James L. Peret, et al., Preparation and Properties of the Boron Phosphides, Journal of The American Ceramic Society, vol. 47 No. 1, pp. 44-46 (Jan. 1964).

Y. Kumashiro, et al.; "Boron Phosphide as a Refractory Semiconductor", Shin-Kinzoku-Kogyo 1989, vol. 34 p. 23-28.

* cited by examiner

BORON PHOSPHIDE-BASED SEMICONDUCTOR DEVICE AND PRODUCTION METHOD THEREOF

CROSS-REFERENCE TO RELATED APPLICATION

This application is a 371 of PCT/JP02/13009, filed Dec. 12, 2002, which claims priority to U.S. Provisional Application, No. 60/343,233 filed Dec. 31, 2001 and Japanese Patent Application 2001-391988 filed Dec. 14, 2001.

TECHNICAL FIELD

The present invention relates to a technique for fabricating a boron phosphide-based compound semiconductor device by utilizing a boron phosphide-based semiconductor layer having p-type or n-type electrical conductivity or high resistance.

BACKGROUND ART

Boron phosphide (BP) is conventionally known as one of Group III-V compound semiconductors (see, Iwao Teramoto, *Handotai Device Gairon (Introduction to Semiconductor Devices)*, page 28, Baifukan (Mar. 30, 1995)). The boron phosphide is an almost covalent bonding semiconductor having a Phillips ionicity (=δ) as small as 0.006 (see, Phillips, *Handotai Ketsugo Ron (Bonds and Bands in Semiconductors)*, 3rd imp., page 51, Yoshioka Shoten (Jul. 25, 1985)). Furthermore, the boron phosphide is a zinc-blend type cubic crystal (see, *Handotai Device Gairon (Introduction of Semiconductor Device)*, supra, page 28) and therefore, degenerated in the valence band unlike hexagonal wurtzite-type semiconductor crystals such as gallium nitride (GaN) (see, Toshiaki Ikoma and Hideaki Ikoma, *Kagobutsu Handotai no Kiso Bussei Nyumon (Guide for Basic Physical Properties of Compound Semiconductor)*, 1st ed., pp. 14–17, Baifukan (Sep. 10, 1991)). Accordingly, boron phosphide is fundamentally facilitated in the formation of a p-type electrically conducting layer as compared with, for example, wurtzite crystal-type GaN having a high ionicity (δ) of 0.500 (see, *Handotai Ketsugo Ron (Bonds and Bands in Semiconductors)*, supra, page 51).

A p-type boron phosphide semiconductor layer is conventionally utilized, for example, as a contact layer for providing an electrode in a laser diode (LD) (see, JP-A-10-242567 (the term "JP-A" as used herein means an "unexamined published Japanese patent application")). There are also known techniques of fabricating LDs or light-emitting diodes (LEDs) from a stacked layer structure having a p-type boron phosphide layer as a buffer layer on a gallium arsenide (GaP), silicon carbide (SiC) or GaN single crystal substrate. In another conventional light-emitting device, a mixed crystal of boron phosphide and aluminum gallium nitride ($Al_xGa_{1-x}N$: $0 \leq X \leq 1$), where a p-type impurity is added, is used as a light-emitting layer (see, JP-A-2-275682). In conventional techniques, the p-type boron phosphide layer is formed by a metal organic chemical vapor deposition (MOCVD) method using magnesium (Mg) or zinc (Zn) as the p-type impurity (see U.S. Pat. No. 6,069, 021).

However, it is pointed out that in so-called undoped boron phosphide where an impurity is not intentionally added, phosphorus occupying the vacancy of boron may be present (see, Katsufusa Shono, *Cho LSI Jidai no Handotai Gijutsu 100 Shu (100 Collections of Semiconductor Technique in VLSI Generation) [III]*, Ohmu Sha (Apr. 1, 1982), Electronics Library 18, pp. 86–87, appendix of "Denshi Zasshi Electronics (Electric Journal Electronics)", Vol. 27, No. 4 (April, 1982)). On the contrary, the possibility of the presence of boron occupying the vacancy of phosphorus is suggested (see, (*Cho LSI Jidai No Handotai Gijutsu (Semiconductor Technique in VLSI Generation) [III]*, supra, pp. 86–87). In other words, there is suggested the possibility that a phosphorus atom occupying the normal lattice site of boron is present. Also, the possibility of the presence of boron occupying the vacancy of phosphorus is suggested. Phosphorus occupying the normal lattice site of zinc-blende type cubic boron phosphide is considered to act as a donor (see, *Cho LSI Jidai No Handotai Gijutsu (Semiconductor Technique in VLSI Time) [III]*), supra, pp. 86–87). On the other hand, boron occupying the normal lattice site of phosphorus is considered to act as an acceptor (see, *Cho LSI Jidai No Handotai Gijutsu (Semiconductor Technique in the VLSI Age) [III]*), supra, pp. 86–87).

As described above, the possibility that the boron phosphide layer contains anti-site is suggested (see, Hideaki Ikoma and Toshiaki Ikoma, *Kagobutsu Handotai no Kiso Bussei Nyumon (Guide for Basic Physical Properties of Compound Semiconductor)*, 1st ed., page 141, Baifukan (Sep. 10, 1991)). The anti-site defect is a defect involving the constituent elements boron (B) and phosphorus (P) and therefore, is present in a large amount. For example, in the state in which phosphorus occupying the vacant lattice point of boron, which is considered to act as a donor, is present in a large amount, even if a p-type impurity is doped, a BP layer showing p-type conduction is not always stably obtained. More specifically, unlike conventional group III-V compound semiconductors having a large ionicity, such as gallium arsenide (GaAs: δ=0.310) and gallium nitride (GaN: δ=0.500), a controlled p-type or n-type boron phosphide-based semiconductor layer, for example, having a small resistivity cannot be stably obtained only by the simple addition of a p-type or n-type impurity.

Moreover, the effect given by the addition of a p-type or n-type impurity on, for example, production of boron vacancy is not yet clarified. Therefore, a p-type or n-type impurity capable of suppressing the change in the concentration of anti-site defects and suitable for stably obtaining a p-type or n-type boron phosphide-based semiconductor layer having a desired resistivity has not been proposed. The present invention has been made to solve the above-described problems of conventional techniques and the object of the present invention is to provide technical means where, in a Group III-V compound semiconductor having a low ionicity and a strong covalent bonding property, particularly in obtaining an n-type or p-type boron phosphide-based semiconductor layer, an n-type or p-type boron phosphide-based semiconductor layer having, for example, precisely controlled carrier concentration can be stably obtained by adding an n-type or p-type impurity while taking account of the relative concentration of anti-site defects. Another object of the present invention is to provide a boron phosphide-based semiconductor device such as a light-emitting device, fabricated by utilizing an n-type or p-type boron phosphide-based semiconductor layer having a desired resistance.

DISCLOSURE OF INVENTION

The present invention provides a boron phosphide-based semiconductor device comprising a single crystal substrate having formed thereon a boron-phosphide (BP)-based semiconductor layer containing boron and phosphorus as constituent elements, where phosphorus (P) occupying the vacant lattice point (vacancy) of boron (B) and boron occupying the vacant lattice point (vacancy) of phosphorus are present in the boron-phosphide (BP)-based semiconductor layer, the boron phosphide-based semiconductor device having characteristic features described in the following items (1) to (4):

(1) a boron phosphide-based semiconductor device comprising a p-type boron phosphide-based semiconductor layer in which boron occupying the vacancy of phosphorus is contained in a higher atomic concentration than phosphorus occupying the vacancy of boron and a p-type impurity of Group II element or Group IV element is added;

(2) a boron phosphide-based semiconductor device comprising an n-type phosphide-based semiconductor layer in which phosphorus occupying the vacancy of boron is contained in a higher atomic concentration than boron occupying the vacancy of phosphorus and an n-type impurity of Group IV element or Group VI element is added;

(3) the boron phosphide-based semiconductor as described in (1) or (2) above, which comprises both a p-type boron phosphide-based semiconductor layer in which boron occupying the vacancy of phosphorus is contained in a higher atomic concentration than phosphorus occupying the vacancy of boron and a p-type impurity of Group II element is added, and an n-type boron phosphide-based semiconductor layer in which phosphorus occupying the vacancy of boron is contained in a higher atomic concentration than boron occupying the vacancy of phosphorus and an n-type impurity of Group IV element is added; and (4) the boron phosphide-based semiconductor device as described in (3) above, wherein the Group II element added as a p-type impurity is at least one element selected from the group consisting of zinc (Zn), cadmium (Cd) and mercury (Hg), and the Group IV element added as an n-type impurity is tin (Sn).

In order to form a boron phosphide-based semiconductor layer suitable for the fabrication of a boron phosphide-based semiconductor device, the present invention also provides the production method of a boron phosphide-based semiconductor layer described in the following items (5) to (12):

(5) a method for producing a boron phosphide-based semiconductor device described in (1) above, comprising vapor-phase growing a p-type boron phosphide-based semiconductor layer on a single crystal substrate while setting the substrate temperature to the range between 1,000° C. to 1,200° C., adjusting the feed ratio of a source material for the Group V constituent element to a source material for the Group III constituent element to the range from 70 to 150, and adding a source material for the p-type impurity of Group II element or Group IV element;

(6) a method for producing a boron phosphide-based semiconductor device described in (2) above, comprising vapor-phase growing an n-type boron phosphide-based semiconductor layer on a single crystal substrate while setting the substrate temperature to the range between 750° C. to 1,000° C., adjusting the feed ratio of a source material for the Group V constituent element to a source material for the Group III constituent element to the range from 70 to 150, and adding a source material for the n-type impurity of Group IV element or Group VI element;

(7) a method for producing a boron phosphide-based semiconductor device described in (3) or (4) above, comprising vapor-phase growing a p-type boron phosphide-based semiconductor layer on a single crystal substrate while setting the substrate temperature to the range between 1,000° C. to 1,200° C., adjusting the feed ratio of a source material for the Group V constituent element to a source material for the Group III constituent element to the range from 70 to 150, and adding a source material for the p-type impurity of Group II element;

(8) a method for producing a boron phosphide-based semiconductor device described in (3) or (4) above, comprising vapor-phase growing an n-type boron phosphide-based semiconductor layer on a single crystal substrate while setting the substrate temperature to the range between 750° C. to 1,000° C., adjusting the feed ratio of a source material for the Group V constituent element to a source material for the Group III constituent element to the range from 70 to 150, and adding a source material for the n-type impurity of a Group IV element;

(9) the method for producing a boron phosphide-based semiconductor device as described in (5) above, wherein the p-type boron phosphide-based semiconductor layer is vapor-phase grown while adding a source material for the Group II or Group IV element, incapable of forming a boron multimer (compositional formula: $RB_x$, wherein R represents a Group II or Group IV element and X is generally a positive even number of 2 to 12);

(10) the method for producing a boron phosphide-based semiconductor device as described in (6) above, wherein the n-type boron phosphide-based semiconductor layer is vapor-phase grown while adding a source material for the Group IV element, incapable of forming a boron multimer (compositional formula: $RB_x$, wherein R represents a Group IV element and X is generally a positive even number of 2 to 12);

(11) the method for producing a boron phosphide-based semiconductor device as described in (9) above, wherein the p-type boron phosphide-based semiconductor layer is vapor-phase grown by adding a source material containing zinc (Zn), cadmium (Cd), mercury (Hg) or tin (Sn); and

(12) the method for producing a boron phosphide-based semiconductor device as described in (10) above, wherein the n-type boron phosphide-based semiconductor layer is vapor-phase grown by adding a source material containing tin (Sn).

Furthermore, the present invention provides:

(13) the boron phosphide-based semiconductor device as described in (1) or (4) above, wherein the semiconductor device is a semiconductor light-emitting device (LED).

BRIEF DESCRIPTION OF THE DRAWINGS

Some of the features and advantages of the invention have been described, and others will be apparent from the detailed description which follows and from the accompanying drawings, in which.

BEST MODE FOR CARRYING OUT THE INVENTION

Figure 1:
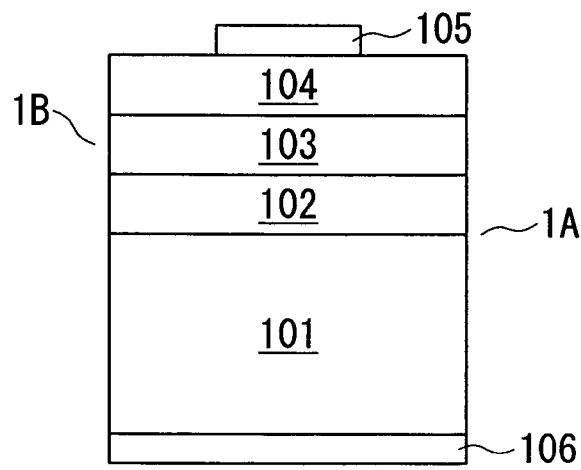
FIG. 1 is a schematic cross-sectional view of LED in Example of the present invention.

The boron phosphide-based semiconductor layer according to the first embodiment of the present invention is suitably composed of a boron phosphide-based semiconductor represented by the formula: $B_\alpha Al_\beta Ga_\gamma In_{1-\alpha-\beta-\gamma} P_{1-\delta} As_\delta$ (wherein $0<\alpha\leq1$, $0\leq\beta<1$, $0\leq\gamma<1$, $0<\alpha+\beta+\gamma\leq$, $0\leq\delta<1$).

The boron phosphide-based semiconductor layer can also be composed of, for example, a boron phosphide-based semiconductor containing nitrogen (N), represented by the formula: $B_\alpha Al_\beta Ga_\gamma In_{1-\alpha-\beta-\gamma} P_{1-\delta} N_\delta$ (wherein $0<\alpha\leq 1$, $0\leq\beta<1$, $0\leq\gamma<1$, $0<\alpha+\beta+\gamma\leq 1$, $0<\delta<1$). The boron phosphide-based semiconductor layer is preferably composed of a binary or ternary mixed crystal having a small number of constituent elements and readily form, for example, a monomer boron phosphide (BP), a boron aluminum phosphide mixed crystal ($B_\alpha Al_\beta P$: $0<\alpha\leq 1$, $\alpha+\beta=1$), a boron gallium phosphide mixed crystal ($B_\alpha Ga_\delta P$: $0<\alpha\leq 1$, $\alpha+\delta=1$) or a boron indium phosphide mixed crystal ($B_\alpha In_{1-\alpha} P$: $0<\alpha\leq 1$).

The p-type or n-type boron phosphide-based semiconductor layer of the present invention is characterized by the relationship of relative concentration between the boron vacancy and the phosphorus vacancy in the so-called undoped state where an impurity is not intentionally added. For example, in the case of an undoped boron phosphide monomer (BP) single crystal, the semiconductor layer is characterized by the quantitative relationship between the phosphorus atom occupying the boron vacancy and the boron atom occupying the phosphorus vacancy. In an ideally constituted crystal lattice of BP single crystal, phosphorus (P) occupying the boron vacancy binds to a peripheral phosphorus (P) atom occupying the lattice site to form a P—P bond, whereas the boron (B) atom occupying the phosphorus vacancy forms a B—B bond with boron (B) at the adjacent lattice site. Therefore, the relative quantitative relationship between the boron atom occupying the phosphorus vacancy and the phosphorus atom occupying the boron vacancy can be known from the quantitative relationship between the P—P bond and the B—B bond. The amounts of these bonds can be determined, for example, by an analysis means such as nuclear magnetic resonance (NMR) analysis and Raman spectroscopic analysis, similarly to the bond (B—P bond) between boron and phosphorus mainly constituting the BP monomer single crystal lattice.

The p-type boron phosphide-base semiconductor layer according to the present invention is characterized in that a condition where the concentration of phosphorus vacancy is higher than that of boron vacancy is formed in the undoped state and a p-type impurity is added (doped) in this condition to obtain a p-type boron phosphide-based semiconductor layer. In the condition where boron vacancy is present in excess of the concentration of phosphorus vacancy, a large amount of donor components such as phosphorus or silicon occupying the boron vacancy is produced. Therefore, even if a p-type impurity is simply added, a low-resistance p-type boron phosphide-based semiconductor layer, for example, having a resistivity (=specific resistance) of 0.1 Ω·cm or less at room temperature cannot be readily and stably obtained. The p-type impurity intentionally added usually acts to electrically compensate the donor component relating to the boron vacancy present in a high concentration exceeding $10^{19}$ to $10^{20}$ cm$^{-3}$. However, a large amount of donors relating to the boron vacancy cannot be electrically compensated to a satisfactory extent and may remain as an n-type layer or, for example, a boron phosphide-based crystal layer having poor electrical conductivity and high resistance with a resistivity exceeding $10^2$ Ω·cm is disadvantageously formed.

When the phosphorus vacancy is present in a higher concentration than the boron vacancy and therefore, a boron phosphide-based semiconductor layer showing p-type conductivity in the undoped state is formed, the p-type impurity added can effectively act as an acceptor. In particular, when p-type conductivity is presented from the beginning, the residual donor component can be electrically compensated by a small amount of p-type impurity and the majority of p-type impurity can act as an acceptor. In such a condition, an advantage is given that a p-type boron phosphide-based semiconductor layer having a controlled resistivity can be stably obtained by increasing or decreasing the amount of p-type impurity added. The same advantage can be obtained also when a plurality of p-type impurities, for example, cadmium (Cd) and zinc (Zn), are added simultaneously. Group II elements which hardly form, for example, a boron multimer compound represented by the compositional formula: $RB_X$ (wherein R represents a Group II element and X is generally a positive even number of 2 to 12), with boron (B) at a temperature of forming a boron phosphide-based semiconductor layer film, can be particularly suitably used as a p-type impurity. Among Group II elements, particularly suitable p-type impurities are zinc (Zn), cadmium (Cd) and mercury (Hg). Furthermore, carbon (C), silicon (Si) and tin (S) of Group IV elements, which hardly form the above-described boron multimer with boron at a temperature of forming a boron phosphide-based semiconductor layer film and become an amphoteric impurity, can also be used.

Magnesium (Mg) heretofore commonly used for obtaining a p-type Group III-V compound semiconductor layer (see, *J. Appl. Phys.*, 58(8), pp. R31–R55 (1985)) forms a boron multimer such as $MgB_4$, $MgB_6$ and $MgB_{12}$ at a temperature lower than 1,050° C. or in the vicinity of 1,150 to 1,200° C. and therefore, is not suitable as a p-type impurity. If a large amount of boron atom is consumed for forming a boron multimer, a large amount of boron vacancy is produced and in turn, anti-site defects of phosphorus (P) occupying the boron vacancy increase. As a result, the donor component increases and the stable formation of a p-type conducting layer is disadvantageously inhibited. On the other hand, zinc (Zn), cadmium (Cd) and mercury (Hg) do not form a multimer with boron, such as $RB_X$, and therefore, these Group II elements are advantageous in that the concentration of boron vacancy can be prevented from increasing due to doping. That is, these Group II elements can prevent the increase of donor-related anti-site defects comprising phosphorus occupying the boron vacancy, exert an activity of suppressing the change of donor concentration as the background, and contribute to the formation of a boron phosphide-based semiconductor layer stabilized in the resistivity, carrier concentration or the like.

Figure 3:
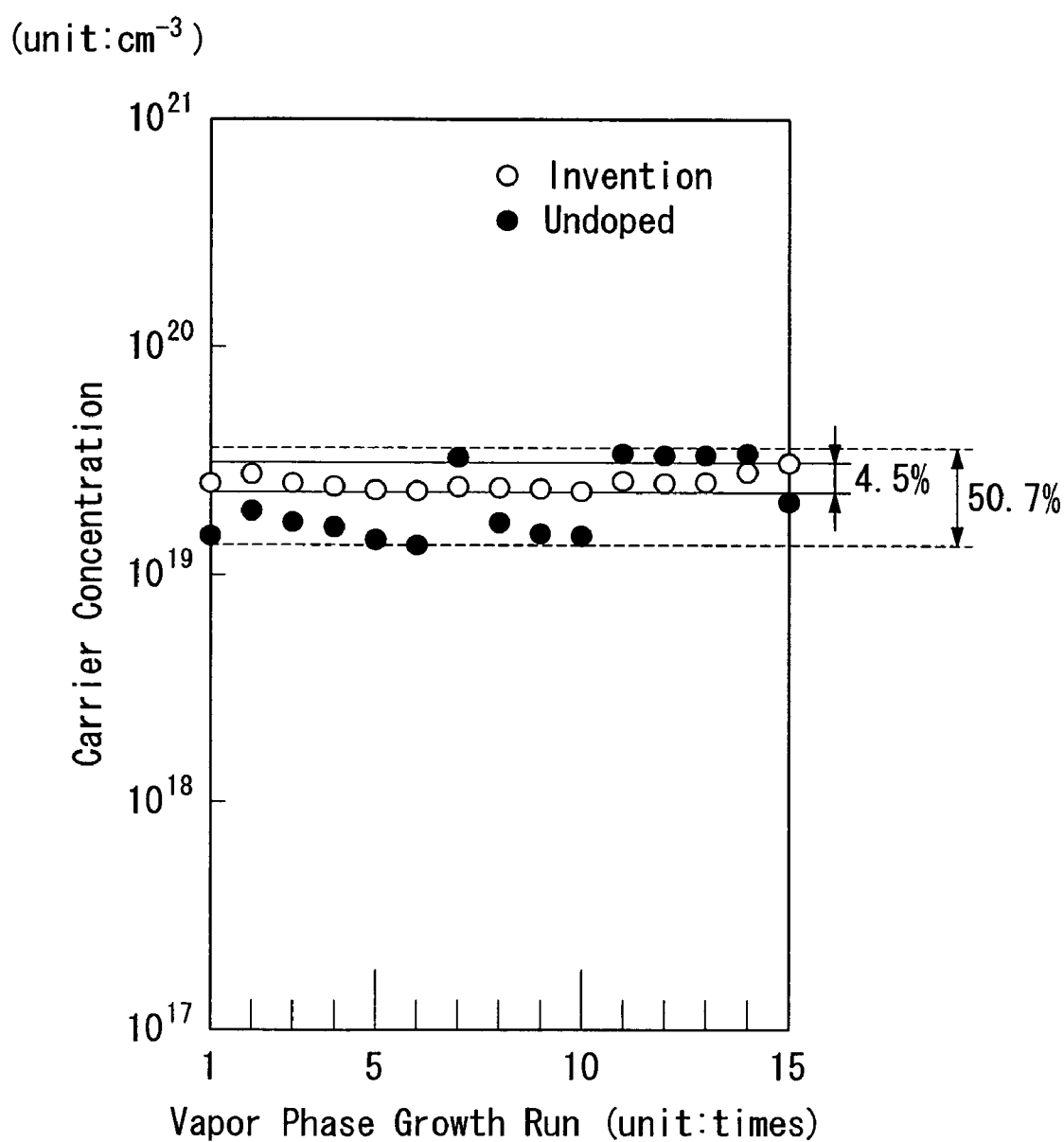
FIG. 3 is a view showing the stability in the carrier concentration of a boron phosphide-based semiconductor layer when zinc is doped and when undoped.

FIG. 3 shows the stability of carrier concentration of a boron phosphide-based semiconductor layer when a condition of showing p-type conductivity, namely, the concentration of boron occupying the phosphorus vacancy exceeding the concentration of phosphorus occupying the boron vacancy, is presented in the undoped state and zinc (Zn) is doped as a p-type impurity. In FIG. 3, a carrier concentration of a monomer p-type boron phosphide (BP) semiconductor layer formed by a metal organic chemical vapor deposition (MOCVD) method while setting the temperature at 1,050° C. and the V/III ratio described later to about 100 is shown. When the doping amount of zinc (Zn) is constant, the obtained carrier concentration is stable with a fluctuation in ±4.5% of the average value which is $3.2\times 10^{19}$ cm$^{-3}$. The resistivity is also stable with a fluctuation almost in the same range. On the other hand, as shown for comparison in FIG. 3, in the undoped case where zinc is not intentionally added, the distribution width is broad as $2.8\times 10^{19}$ cm$^{-3}$±50.7% and the carrier concentration is unstable. In other words, it is apparent that only by the technical means of presenting the condition where the relative concentration of anti-site relating to the boron or phosphorus vacancy is simply specified, a boron phosphide-based semiconductor layer having a desired carrier concentration or resistivity cannot be stably obtained. If magnesium (Mg) which forms a boron multimer such as $MgB_4$ at 750 to 1,200° C. suitable for the film formation of boron phosphide (BP) is added as a p-type impurity, the amount of anti-site of phosphorus occupying the boron vacancy generated accompanying the formation of multimer increases and therefore, unlike the above-described zinc (Zn) doping, a p-type boron phosphide-base semiconductor layer stabilized in the carrier concentration or resistivity cannot be obtained. If the doping amount of Mg is increased, the donor component comprising phosphorus occupying a larger amount of boron vacancy increases and this gives rise to failure in obtaining a p-type conducting layer and sometimes to the formation of a high-resistance layer.

In the condition where phosphorus vacancy is already present in excess of the concentration of boron vacancy in the undoped state, in other words, boron atom occupying the phosphorus vacancy, acting as an acceptor, is present in a large amount, even if an n-type impurity is added, the entire amount cannot be electrically compensated and a p-type layer containing residual acceptor components may be disadvantageously formed or only a high-resistance layer is obtained. When a condition in which the boron vacancy is present in a concentration higher than the phosphorus vacancy is created in the undoped state as in the present invention, the majority of n-type impurity added can act as an electrically active donor, though a part of the n-type impurity is consumed to form a donor/acceptor pair with the acceptor. Accordingly, in such a condition, an advantage is given that an n-type boron phosphide-based semiconductor layer having a controlled resistivity can be stably obtained by increasing or decreasing the amount of n-type impurity added. Examples of the n-type impurity include Group IV elements such as silicon (Si) and tin (Sn), and Group VI elements such as selenium (Se), sulfur (S) and tellurium (Te). The same advantage can be obtained by adding a plurality of n-type impurities, for example, tin (Sn) and silicon (Si), in combination.

In particular, tin (Sn) does not form a boron multimer such as $SnB_X$ (wherein X represents a compositional ratio of boron and X is generally a positive even number of 2 to 12) and therefore, increase in the concentration of boron vacancy due to doping and in turn, increase in the amount of donor-related anti-site defect comprising phosphorus occupying the boron vacancy can be prevented. As a result, the donor concentration as the background can be prevented from fluctuating due to doping and a boron phosphide-based semiconductor layer having a constant resistivity, carrier concentration or the like can be stably obtained. Examples of the tin (Sn) source include organic tin compounds such as tetraethyltin $((C_2H_5)_4Sn)$.

The boron phosphide-based semiconductor layer film is formed, for example, by vapor phase growth means on a single crystal substrate such as silicon single crystal (silicon), gallium phosphide (GaP), gallium arsenide (GaAs), silicon carbide (SiC) or boron phosphide (BP) (see, (1) *J. Electrochem. Soc.*, 120, pp. 802–806 (1973) and (2) U.S. Pat. No. 5,042,043). Examples of the vapor phase growth means for obtaining a boron phosphide-based semiconductor layer include an MOCVD method using a triethylborane $((C_2H_5)_3B)$/phosphine $(PH_3)$/hydrogen $(H_2)$ growth reaction system (see, *Inst. Phys. Conf. Ser.*, No. 129, pp. 157–162, IOP Publishing Ltd. (1993)). Other examples include a halogen vapor-phase growth method using a reaction system of boron trichloride $(BCl_3)$/phosphorus trichloride $(PCl_3)$/$H_2$, and a hydride vapor-phase growth method using a reaction system of diborane $(B_2H_6)$/$PH_3$/$H_2$. Also, a molecular beam epitaxial growth method can be used (see, *J. Solid State Chem.*, 133, pp. 269–272 (1997)).

The temperature range suitable for the formation of the boron phosphide crystal layer is from about 750° C. to 1,200° C. At a high temperature exceeding about 1,200° C., a multimer such as $B_{13}P_2$ is generated (see, *J. Am. Ceram. Soc.*, 47(1), pp. 44–46 (1964)) and this inhibits the formation of a compositionally homogeneous boron phosphide-based semiconductor layer. In the triethylborane $((C_2H_5)_3B)$/phosphine $(PH_3)$/hydrogen $(H_2)$ MOCVD vapor phase growth means, the film formation temperature (substrate temperature) is suitably between 750° C. to 1,000° C. for obtaining a boron phosphide-based compound semiconductor layer where the concentration of phosphorus atom occupying the boron vacancy or donor component involving the boron vacancy is, in the undoped state, higher than the concentration of acceptor involving the phosphorus vacancy. On the other hand, for obtaining a boron phosphide-based compound semiconductor layer where the concentration of boron atom occupying the phosphorus vacancy or acceptor component involving the phosphorus vacancy is, in the undoped state, higher than the concentration of donor involving the boron vacancy, the film formation temperature (substrate temperature) is suitably between 1,000° C. to 1,200° C.

In the film formation of boron phosphide-based semiconductor layer at the above-described suitable temperature range, if the V/III feed ratio is less than 70, a polycrystal layer comprising a mixture of various crystal planes present on the substrate surface is formed and a single crystal layer cannot be obtained. In the polycrystal layer, dislocation is generated at the grain boundary or the crystallographic or electrical quality deteriorates, for example, the carrier mobility decreases due to the presence of grain boundary, and these are disadvantageous for fabricating a boron phosphide-based compound semiconductor device having high performance. When the V/III feed ratio is in the range from 70 to 120, the crystal planes constituting the boron phosphide-based compound semiconductor layer become uniform. If the V/III feed ratio exceeds 120, the Group V element such as phosphorus is excessively fed to generate deposits containing phosphorus or the like and the obtained boron phosphide-based semiconductor layer is disadvantageously lacking in the surface smoothness.

The n-type or p-type boron phosphide-based semiconductor layer according to the present invention is stabilized in the resistivity or carrier concentration, and therefore, can be advantageously used for obtaining a boron phosphide-based semiconductor device stabilized in the properties. For example, a boron phosphide-based semiconductor diode or the like having a pn junction structure and stabilized in the properties can be fabricated using both n-type and p-type boron phosphide-based semiconductor layers of the present invention. For example, in LED or LD, when the p-type and n-type boron phosphide-based semiconductor layers stabilized in the resistivity are used as clad layers for sandwiching a light-emitting layer, an LED or LD having a pn junction double-hetero (DH) structure stabilized in the forward voltage (Vf) or threshold voltage (Vth) can be fabricated. The light-emitting layer can be composed of, for example, a gallium indium nitride mixed crystal ($Ga_XIn_{1-X}N$: $0 \leq X \leq 1$) or a gallium phosphide nitride mixed crystal ($GaP_YN_{1-Y}$: $0<Y<1$) containing nitrogen (N) and a Group V element other than nitrogen, such as phosphorus (P), as constituent elements. In particular, when the light-emitting layer is constituted from $Ga_xIn_{1-x}N$ mixed crystal ($0 \leq X \leq 1$) or $GaP_yN_{1-Y}$ mixed crystal ($0<Y<1$), which have a composition of giving a lattice spacing reduced in mismatching to boron phosphide-based semiconductor layers as clad layers, a light-emitting device having excellent brightness properties can be fabricated.

The boron occupying the phosphorus vacancy, which is present in a concentration exceeding the phosphorus atom occupying the boron vacancy in the boron phosphide-based compound semiconductor layer, has activity of giving a background for presenting p-type conductivity, stably giving a p-type boron phosphide-based compound semiconductor layer by the addition of a p-type impurity, and giving a p-type boron phosphide-based compound semiconductor layer controlled in the resistivity and carrier concentration by the control of the amount of p-type impurity added.

The phosphorus occupying the boron vacancy, which is present in a concentration exceeding the boron atom occupying the phosphorus vacancy in the boron phosphide-based compound semiconductor layer, has activity of giving a background for presenting n-type conductivity, stably giving an n-type boron phosphide-based compound semiconductor layer by the addition of an n-type impurity, and giving an n-type boron phosphide-based compound semiconductor layer controlled in the resistivity and carrier concentration by the control of the amount of n-type impurity added.

EXAMPLE

The present invention is specifically described below by referring to the case where a boron phosphide-based semiconductor light-emitting diode (LED) is fabricated by utilizing p-type and n-type boron phosphide (BP) semiconductor layers provided on a silicon single crystal substrate.

FIG. 1 is a view schematically showing the cross section of LED 1B according to this Example. For the single crystal substrate 101, a boron (B)-doped p-type silicon single crystal with the (111) crystal plane surface was used. On the substrate 101 surface, a lower clad layer 102 composed of a zinc (Zn)-doped (111) p-type boron phosphide (BP) was formed at 1,050° C. by an atmospheric pressure MOCVD method using a triethylborane $((C_2H_5)_3B)$/phosphine $(PH_3)$/hydrogen $(H_2)$ system. At the formation, the V/III ratio ($=PH_3/(C_2H_5)_3B$ feed ratio) was set to about 115. By the analysis using a laser Raman spectroscopic method or the like, the concentration of boron occupying the phosphorus vacancy in the undoped BP layer grown at the same temperature and the same V/III ratio was higher than the concentration of phosphorus occupying the boron vacancy and the amount thereof was in excess of about $1 \times 10^{19}$ cm$^{-3}$. A dimethylzinc $((CH_3)_2Zn)$-hydrogen mixed gas (mixing ratio by volume: about 100 vol. ppm) was used as the zinc doping source and the carrier concentration of the lower clad layer 102 was set to about $1 \times 10^{19}$ cm$^{-3}$. The amount of dimethylzinc fed was $2 \times 10^{-6}$ mol/min. The boron phosphide (BP) constituting the lower clad layer 102 in a layer thickness of about 400 nm had a band gap width of about 3 electron volt (eV) at room temperature.

Figure 2:
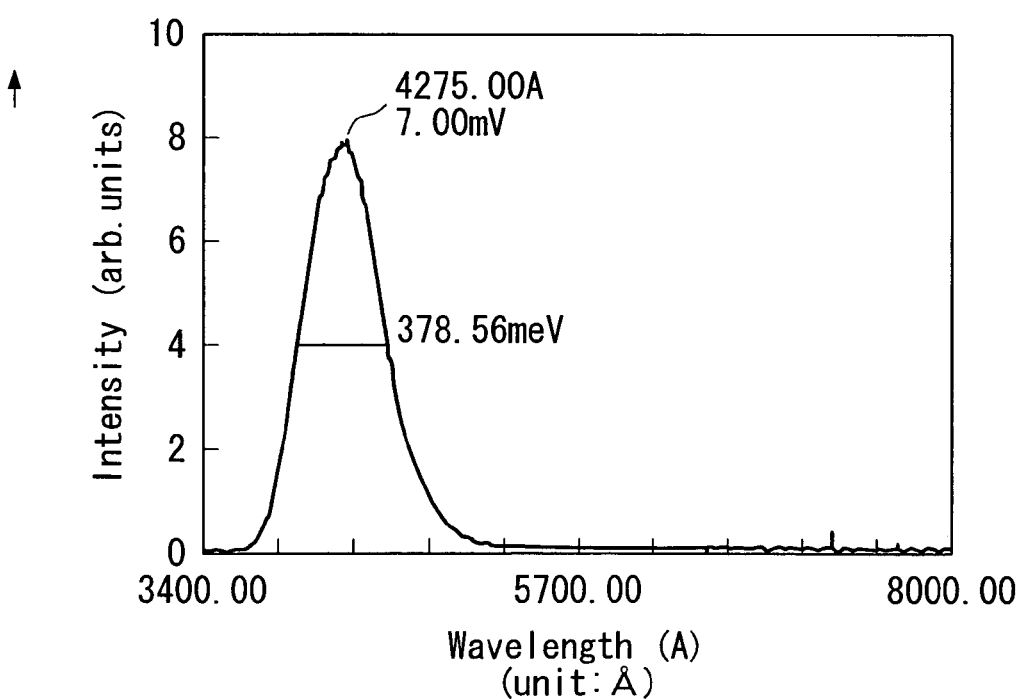
FIG. 2 is a PL spectrum of the light-emitting layer of LED in Example of the present invention.

On the cubic zinc-blend crystal-type (spharelite) BP lower clad layer 102, a light-emitting layer 103 composed of n-type gallium indium nitride of hexagonal wurtzite crystal type was formed. The $Ga_{0.94}In_{0.06}N$ layer as the light-emitting layer 103 was grown at 850° C. by an atmospheric MOCVD vapor phase growth method using a trimethylgallium $((CH_3)_3Ga)$/trimethylindium $((CH_3)_3In)$/ammonia $(NH_3)$/argon $(Ar)$/hydrogen $(H_2)$ system. The carrier concentration of the light-emitting layer 103 was about $2 \times 10^{18}$ cm$^{-3}$ and the layer thickness was about 600 nm. FIG. 2 shows a photoluminescence (PL) spectrum from the light-emitting layer 103 on incidence of a helium (He)-cadmium (Cd) laser ray at a wavelength of 325 nm. The center wavelength of PL light was about 427.5 nm. When the incident intensity of laser ray was set to about 0.2 milliwatt (mW), the PL intensity was about 7.0 millivolt (mV) and the half width of blue violet PL spectrum was about 378.6 millielectron volt (meV).

On the light-emitting layer 103, an upper clad layer 104 composed of a tin (Sn)-doped n-type BP layer was formed at 850° C. by the atmospheric MOCVD method used above for the film formation of boron phosphide (BP) layer. At the formation, the V/III ratio ($=PH_3/(C_2H_5)_3B$ feed ratio) was set to about 100. By the analysis using a laser Raman spectroscopic method, the concentration of phosphorus occupying the boron vacancy in the undoped BP layer grown at the same temperature and the same V/III ratio was higher than the concentration of boron occupying the phosphorus vacancy and the amount thereof was determined as about $3 \times 10^{19}$ cm$^{-3}$. For the tin doping source, tetraethyltin was used. The amount of tetraethyltin fed was $1.0 \times 10^{-6}$ mol/min and the carrier concentration of the upper clad layer 104 was adjusted to $4 \times 10^{19}$ cm$^{-3}$. The band gap at room temperature of the n-type BP layer constituting the upper clad layer 104 was determined as about 3 eV from the wavelength (photon energy) dependency of the absorption coefficient. The thickness of the upper clad layer 104 was about 400 nm.

In the stacked layer structure 1A consisting of the single crystal substrate 101, the lower clad layer 102, the light-emitting layer 103 and the upper clad layer 104, a circular (diameter: 110 μm) ohmic n-type surface electrode 105 composed of a gold-germanium (Au—Ge) alloy was disposed at the center of the upper clad layer 104. Furthermore, an ohmic p-type back surface electrode 106 composed of aluminum (Al) was provided almost throughout the back surface of the p-type silicon single crystal substrate 101, thereby obtaining LED 1B having a pn-junction double hetero-junction structure. After an electrode material was attached for the electrodes 105 and 106, both electrodes were subjected to an alloying heat-treatment at 420° C. for 3 minutes in a nitrogen stream.

To the n-side up LED 1B, a forward current of 20 milliampere (mA) was passed, as a result, the following characteristic features (a) to (d) were obtained.

(a) Light emission center wavelength: about 430 nm
(b) Brightness: 0.8 candela (cd)
(c) Forward voltage: 3 volt (V)
(d) Reverse voltage: 8 V (reverse current=10 μA)

Since the lower and upper clad layers 102 and 105 sandwiching the light-emitting layer were constituted by an n-type or p-type boron phosphide layer having a high carrier concentration, an LED having a low forward voltage and emitting blue violet light could be provided. Furthermore, since the clad layers 102 and 105 were composed of a monomer boron phosphide having a band gap width sufficiently large to penetrate the light emitted, a high-brightness blue violet LED was provided.

Industrial Applicability

According to the present invention, in a boron phosphide-based semiconductor device comprising a single crystal substrate such as silicon having formed thereon a boron phosphide-based based semiconductor layer in which both phosphorus occupying the boron vacancy and boron occupying the phosphorus vacancy are present and boron and phosphorus are contained as constituent elements, at the formation of a boron phosphide-based semiconductor layer showing p-type conductivity by a vapor phase growth method, the p-type boron phosphide-based compound semiconductor layer is obtained by creating in the undoped state a condition that boron occupying the phosphorus vacancy is present in a higher atomic concentration than phosphorus occupying the boron vacancy and at the same time, adding a p-type impurity of Group II element or Group IV element, so that a boron phosphide-based semiconductor device having, for example, excellent electrical properties can be provided by using a boron phosphide-base semiconductor layer stabilized in the resistivity or carrier concentration.

Furthermore, according to the present invention, an n-type boron phosphide-based compound semiconductor layer is obtained by creating in the undoped state a condition that phosphorus occupying the boron vacancy is present in a higher atomic concentration than boron occupying the phosphorus vacancy and further adding an n-type impurity of Group IV element or Group VI element, so that a boron phosphide-based semiconductor device having, for example, excellent electrical properties can be provided by using a boron phosphide-base semiconductor layer stabilized in the resistivity or carrier concentration.

In particular, accordingly to the present invention, a boron phosphide-based semiconductor layer having n-type or p-type conductivity is obtained by adding, as an n-type or p-type impurity, an element incapable of forming a multimer with boron in the temperature range suitable for the vapor phase growth of the boron phosphide-base semiconductor layer, so that unstableness in the resistivity due to the fluctuation of vacancy concentration accompanying the formation of a boron multimer can be eliminated and this can contribute to the stable formation of a boron phosphide-based semiconductor layer having a high carrier concentration and also can provide an effect of giving, for example, a power saving-type boron phosphide-based semiconductor light-emitting device having a low forward voltage by using the electrically conducting layer having a high carrier concentration.

According to the present invention, a p-type boron phosphide-based semiconductor layer is formed on a single crystal substrate at a temperature between 1,000° C. to 1,200° C. by setting the feed ratio of the Group V constituent element to the Group III constituent element to the range from 70 to 150 and at the same time, while adding a p-type impurity of Group II element or Group IV element, so that the amount of acceptor consumed for the electrical compensation of residual donor component can be reduced and a p-type boron phosphide-based semiconductor layer having a high carrier concentration and a low resistivity can be stably formed.

Furthermore, according to the present invention, an n-type boron phosphide-based semiconductor layer is formed on a single crystal substrate at a temperature between 750° C. to 1,000° C. by setting the feed ratio of Group V constituent element to Group III constituent element to the range from 70 to 150 and at the same time, while adding an n-type impurity of Group IV element or Group VI element, so that the amount of n-type impurity consumed for the electrical compensation of residual acceptor component can be reduced and a p-type boron phosphide-based semiconductor layer having a high carrier concentration and a low resistivity can be stably formed.

Having thus described exemplary embodiments of the invention, it will be apparent that various alterations, modifications, and improvements will readily occur to those skilled in the art. Such alterations, modifications, and improvements, though not expressly described above, are nonetheless intended and implied to be within the spirit and scope of the invention. Accordingly, the foregoing discussion is intended to be illustrative only; the invention is limited and defined only by the following claims and equivalents thereto.

What is claimed is:

1. A boron phosphide-based semiconductor device including a single crystal substrate having formed thereon a boron-phosphide (BP)-based semiconductor layer containing boron and phosphorus as constituent elements, where phosphorus (P) occupying the vacant lattice point (vacancy) of boron (B) and boron occupying the vacant lattice point (vacancy) of phosphorus are present in the boron-phosphide (BP)-based semiconductor layer, the boron phosphide-based semiconductor device comprising:

both a p-type boron phosphide-based semiconductor layer in which boron occupying the vacancy of phosphorus is contained in a higher atomic concentration than phosphorus occupying the vacancy of boron and a p-type impurity of Group II element is added, and an n-type boron phosphide-based semiconductor layer in which phosphorus occupying the vacancy of boron is contained in a higher atomic concentration than boron occupying the vacancy of phosphorus and an n-type impurity of Group IV element is added, wherein the Group II element added as a p-type impurity is at least one element selected from the group consisting of zinc (Zn), cadmium (Cd) and mercury (Hg), and the Group IV element added as an n-type impurity is tin (Sn).

2. A method for producing a boron phosphide-based semiconductor device including a single crystal substrate having formed thereon a boron-phosphide (BP)-based semiconductor layer containing boron and phosphorus as constituent elements, where phosphorus (P) occupying the vacant lattice point (vacancy) of boron (B) and boron occupying the vacant lattice point (vacancy) of phosphorus are present in the boron-phosphide (BP)-based semiconductor layer, the boron phosphide-based semiconductor device comprising:

both a p-type boron phosphide-based semiconductor layer in which boron occupying the vacancy of phosphorus is contained in a higher atomic concentration than phosphorus occupying the vacancy of boron and a p-type impurity of Group II element is added, and an n-type boron phosphide-based semiconductor layer in which phosphorus occupying the vacancy of boron is contained in a higher atomic concentration than boron occupying the vacancy of phosphorus and an n-type impurity of Group IV element is added, wherein the Group II element added as a p-type impurity is at least one element selected from the group consisting of zinc (Zn), cadmium (Cd) and mercury (Hg), and the Group IV element added as an n-type impurity is tin (Sn), comprising the step of:

vapor-phase growing a p-type boron phosphide-based semiconductor layer on a single crystal substrate while setting the substrate temperature to a range between 1,000° C. to 1,200° C., adjusting the feed ratio of a source material for the boron constituent element to a source material for the phosphorus constituent element to a range from 70 to 150, and adding a source material for the p-type impurity of Group II element.

3. A method for producing a boron phosphide-based semiconductor device including a single crystal substrate having formed thereon a boron-phosphide (BP)-based semiconductor layer containing boron and phosphorus as constituent elements, where phosphorus (P) occupying the vacant lattice point (vacancy) of boron (B) and boron occupying the vacant lattice point (vacancy) of phosphorus are present in the boron-phosphide (BP)-based semiconductor layer, the boron phosphide-based semiconductor device comprising:

both a p-type boron phosphide-based semiconductor layer in which boron occupying the vacancy of phosphorus is contained in a higher atomic concentration than phosphorus occupying the vacancy of boron and a p-type impurity of Group II element is added, and an n-type boron phosphide-based semiconductor layer in which phosphorus occupying the vacancy of boron is contained in a higher atomic concentration than boron occupying the vacancy of phosphorus and an n-type impurity of Group IV element is added, wherein the Group II element added as a p-type impurity is at least one element selected from the group consisting of zinc (Zn), cadmium (Cd) and mercury (Hg), and the Group IV element added as an n-type impurity is tin (Sn), comprising the step of:

vapor-phase growing an n-type boron phosphide-based semiconductor layer on a single crystal substrate while setting the substrate temperature to a range 750° C. to 1,000° C., adjusting the feed ratio of a source material for the boron constituent element to a source material for the phosphorous constituent element to a range from 70 to 150, and adding a source material for the n-type impurity of Group IV element.

4. A method for producing a boron phosphide-based semiconductor device according to claim 2, wherein the p-type boron phosphide-based semiconductor layer is vapor-phase grown while adding a source material for the Group II element, incapable of forming a boron multimer expressed by a compositional formula of $RB_x$, wherein R represents a Group II element and X is generally a positive even number of 2 to 12.

5. A method for producing a boron phosphide-based semiconductor device according to claim 3, wherein the n-type boron phosphide-based semiconductor layer is vapor-phase grown while adding a source material for the Group IV element, incapable of forming a boron multimer expressed by a compositional formula of $RB_x$, wherein R represents a Group IV element and X is generally a positive even number of 2 to 12.

6. A method for producing a boron phosphide-based semiconductor device according to claim 4, wherein the p-type boron phosphide-based semiconductor layer is vapor-phase grown by adding a source material containing zinc (Zn), cadmium (Cd) or mercury (Hg).

7. A method for producing a boron phosphide-based semiconductor device according to claim 5, wherein the n-type boron phosphide-based semiconductor layer is vapor-phase grown by adding a source material containing tin (Sn).

8. A boron phosphide-based semiconductor device according to claim 1, wherein the semiconductor device is a semiconductor light-emitting device (LED).

* * * * *

UNITED STATES PATENT AND TRADEMARK OFFICE
CERTIFICATE OF CORRECTION

| | |
|---|---|
| PATENT NO. | : 7,018,728 B2 |
| APPLICATION NO. | : 10/467677 |
| DATED | : March 28, 2006 |
| INVENTOR(S) | : Takashi Udagawa |

It is certified that error appears in the above-identified patent and that said Letters Patent is hereby corrected as shown below:

At column 1, line 11, please delete "2001-391988" and insert "2001-381988"

Signed and Sealed this

Twenty-fifth Day of July, 2006

JON W. DUDAS
*Director of the United States Patent and Trademark Office*